United States Patent
Zhong et al.

(10) Patent No.: US 10,854,809 B2
(45) Date of Patent: Dec. 1, 2020

(54) STT-MRAM HEAT SINK AND MAGNETIC SHIELD STRUCTURE DESIGN FOR MORE ROBUST READ/WRITE PERFORMANCE

(71) Applicant: Taiwan Semiconductor Manufacturing Company Ltd., Hsinchu (TW)

(72) Inventors: Tom Zhong, Saratoga, CA (US); Jesmin Haq, Milpitas, CA (US); Zhongjian Teng, Santa Clara, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/857,782

(22) Filed: Dec. 29, 2017

(65) Prior Publication Data

US 2019/0207083 A1  Jul. 4, 2019

(51) Int. Cl.
| | |
|---|---|
| *H01L 43/02* | (2006.01) |
| *G11C 11/16* | (2006.01) |
| *H01L 43/10* | (2006.01) |
| *H01L 27/22* | (2006.01) |
| *H01L 43/08* | (2006.01) |
| *H01L 43/12* | (2006.01) |

(52) U.S. Cl.
CPC .......... *H01L 43/02* (2013.01); *G11C 11/161* (2013.01); *H01L 27/222* (2013.01); *H01L 43/08* (2013.01); *H01L 43/10* (2013.01); *H01L 43/12* (2013.01)

(58) Field of Classification Search
CPC ....... H01L 43/02; H01L 43/08; H01L 27/222; H01L 43/12; G11C 11/161
See application file for complete search history.

(56) References Cited

U.S. PATENT DOCUMENTS

| | | | |
|---|---|---|---|
| 6,381,094 B1 * | 4/2002 | Gill | B82Y 10/00 360/125.3 |
| 7,262,069 B2 | 8/2007 | Chung et al. | |
| 7,829,980 B2 | 11/2010 | Molla et al. | |
| 8,125,057 B2 | 2/2012 | Bonin et al. | |
| 8,194,436 B2 | 6/2012 | Fukami et al. | |
| 9,024,399 B2 | 5/2015 | Guo | |
| 9,081,669 B2 | 7/2015 | Tadepalli et al. | |
| 9,911,914 B1 * | 3/2018 | Annunziata | H01L 27/222 |
| 2006/0019431 A1 * | 1/2006 | Kasko | H01L 43/12 438/124 |

(Continued)

OTHER PUBLICATIONS

"Impact of Self-Heating on Reliability of a Spin-Torque-Transfer RAM Cell," by Subho Chatterjee et al., IEEE Transactions on Electron Devices, vol. 59, No. 3, Mar. 2012, pp. 791-799.

(Continued)

*Primary Examiner* — Charles D Garber
*Assistant Examiner* — S M Sohel Imtiaz
(74) *Attorney, Agent, or Firm* — Haynes and Boone, LLP

(57) ABSTRACT

An STT-MRAM device incorporating a multiplicity of MTJ junctions is encapsulated so that it dissipates heat produced by repeated read/write processes and is simultaneously shielded from external magnetic fields of neighboring devices. In addition, the encapsulation layers can be structured to reduced top lead stresses that have been shown to affect DR/R and Hc. We provide a device design and its method of fabrication that can simultaneously address all of these problems.

20 Claims, 7 Drawing Sheets

(56) References Cited

U.S. PATENT DOCUMENTS

| | | | |
|---|---|---|---|
| 2006/0273418 A1 | 12/2006 | Chung et al. | |
| 2007/0058422 A1 | 3/2007 | Phillips et al. | |
| 2014/0061827 A1* | 3/2014 | Huang | H01L 43/12 257/421 |
| 2015/0091109 A1 | 4/2015 | Allinger et al. | |
| 2015/0243883 A1* | 8/2015 | Swaminathan | H01L 43/08 438/761 |
| 2016/0190432 A1* | 6/2016 | Shum | H01L 27/222 257/427 |
| 2016/0254209 A1* | 9/2016 | Oohiraki | H01L 23/3735 257/707 |
| 2017/0186943 A1* | 6/2017 | Annunziata | H01L 43/08 |
| 2018/0182809 A1* | 6/2018 | Liu | H01L 43/12 |
| 2018/0358545 A1* | 12/2018 | Sundar | H01L 21/02274 |

OTHER PUBLICATIONS

"Compact Model of Dielectric Breakdown in Spin-Transfer Torque Magnetic Tunnel Junction," by You Wang et al., IEEE Transactions on Electron Devices, vol. 63, No. 4, Apr. 2016, pp. 1762-1767.
"SPICE modelling of magnetic tunnel junctions written by spin-transfer torque," by W. Guo et al., HAL archives, HAL Id: hal-00569612, Feb. 25, 2011, 16 pgs.

\* cited by examiner

| 10 | Pin Layer |
|---|---|
| 11 | Barrier |
| 12 | Free layer |
| 13 | Hard mask 1 (Ta, or TiN, or other conductive material) |
| 14 | Hard mask 2 (non-conductive or conductive material such as SiON, or TiN, etc) |
| 15 | Photo resist pattern layer |
| 16 | Encapsulation layer for MTJ device (SiN, or SiO2, or AlO, or AlN, or MgO, etch) |
| 17 | Interlayer Dielectric fill layer (SiN, or SiO2, etc) |
| 18 | Bit line metal layer |

*FIG. 2*

| Step 1 | Magnetic film stack deposition |
|---|---|
| Step 2 | Photo pattern MTJ junction |
| Step 3 | MTJ layer etch |
| Step 4 | Deposit encapsulation layer (SiN, SiO2, AL2O3, MgO, etc) |
| Step 5 | Deposit interlayer dielectric layer and fabricate BIT layer to connect to MTJ |

*FIG. 3*

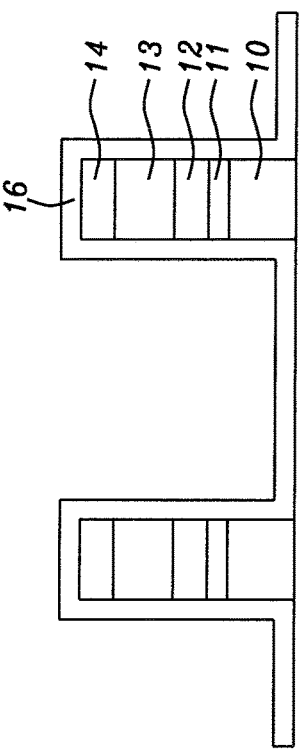
FIG. 4a
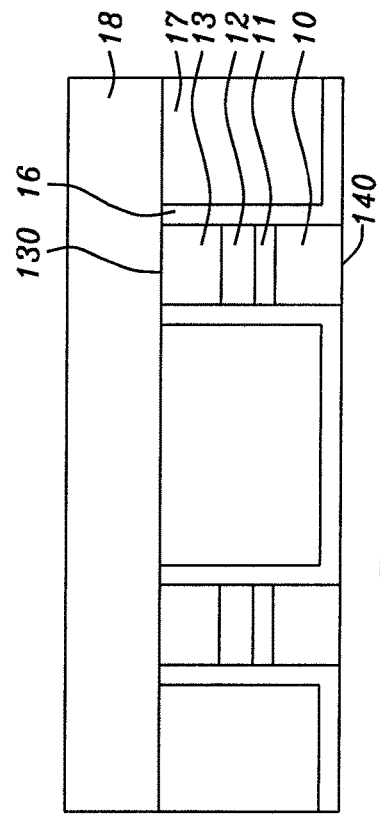
FIG. 4b
FIG. 4c
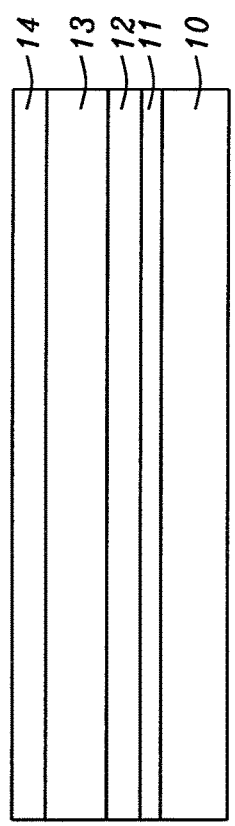
FIG. 4d
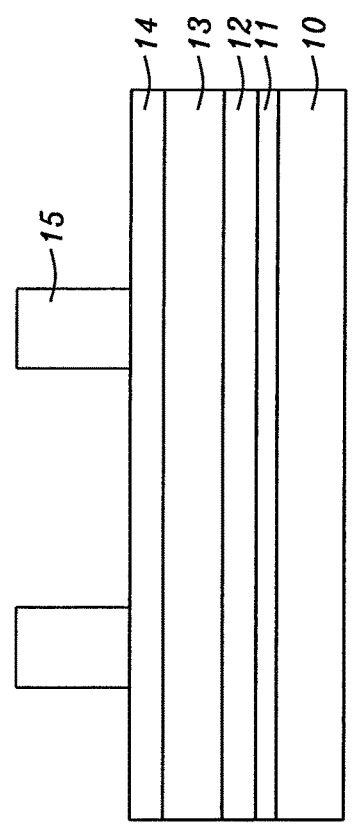
FIG. 4e

| 10 | Pin Layer |
|---|---|
| 11 | Barrier |
| 12 | Free layer |
| 13 | Hard mask 1 (Ta, or tiN, or other conductive material) |
| 14 | Hard mask 2 (non-conductive or conductive material such as SiON, or TiN, etc) |
| 15 | Photo resist pattern layer |
| 16 | Encapsulation layer for MTJ device (SiN, or SiO2, or AlO, or AlN, or MgO, etch) |
| 17 | Interlayer Dielectric fill layer (SiN, or SiO2, etc) |
| 18 | Bit line metal layer |
| 19 | High thermal cnoductivity layer (Metal such as Ti, TiN, Cu, Ta, TaN, W, Al, AlN, etc) |
| 20 | Hard mask layer for 19 patterning (SiO2, SiN, or others) |

*FIG. 5*

| Step 1 | Magnetic film stack deposition |
|---|---|
| Step 2 | Photo pattern MTJ junction |
| Step 3 | MTJ layer etch |
| Step 4 | Deposit encapsulation layer (SiN, SiO2, AL203, MgO, etc) + Heat sink layer + Hard mask layer |
| Step 5 | Self-align etch approach to pattern heat sink layer |
| Step 6 | Deposit interlayer dielectric layer and fabricate BIT layer to connect to MTJ |

*FIG. 6*

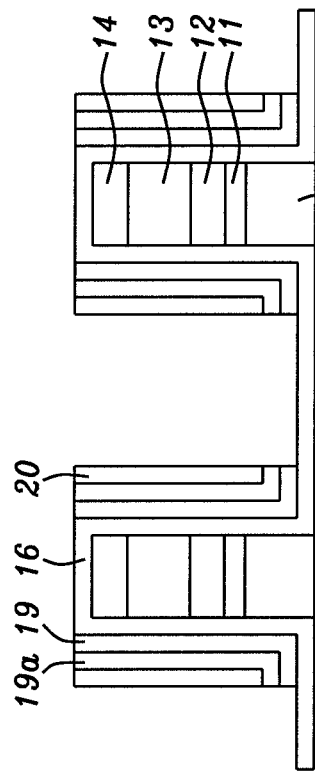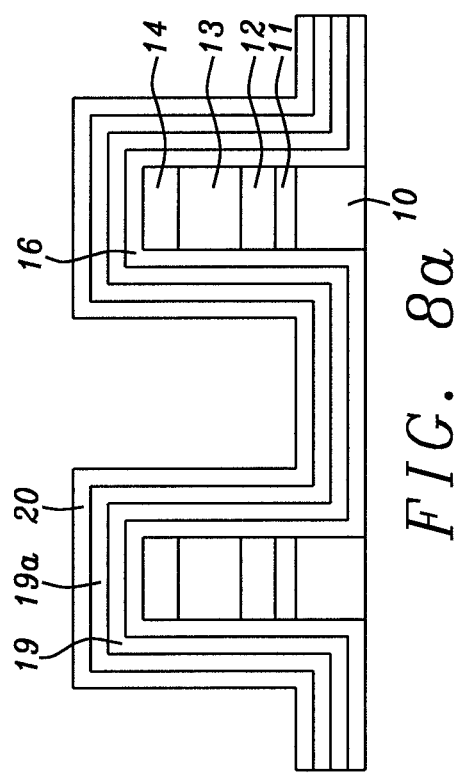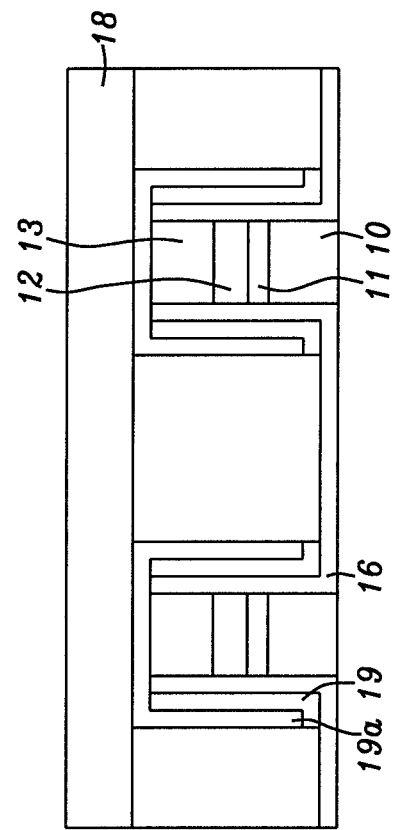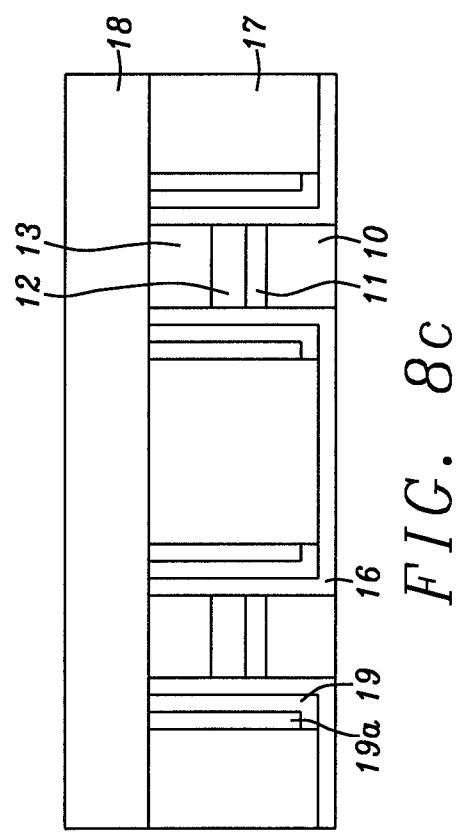

STT-MRAM HEAT SINK AND MAGNETIC SHIELD STRUCTURE DESIGN FOR MORE ROBUST READ/WRITE PERFORMANCE

BACKGROUND

1. Technical Field

This disclosure relates generally to magnetic storage devices, specifically to STT-MRAM (Spin Torque Transfer-Magnetic Random Access Memory) devices and methods to improve their thermal stability.

2. Description of the Related Art

STT-MRAM is becoming an increasingly promising candidate for future generation non-volatile working memory to replace embedded flash memory and embedded SRAM (Static Random Access Memory). However, there are challenges in scaling down this technology to 20 nm (nanometers) dimensions and beyond. One such challenge is to enhance the thermal stability of smaller MTJ (magnetic tunneling junction) devices, which is one type of storage cell employed in MRAM. Studies have reported that self-heating of the MTJ junction occurs during read/write cycles (see, for example, S. Chatterjee, S. Salahuddin, S. Kumar, and S. Mukhopadhyay, IEEE Transactions on Electron Device, Vol. 59. No. 3, March 2012; Y. Wang, H. Cai, L. Naviner, Y. Zhang, $\lambda$. Zhao, E. Deng, J. Klein, and W. Zhao, IEEE Transaction on Electron Device, Vol. 63, No. 4. April 2016; W. Guo, G. Prenat, V. Javerliac, M. Baraji, N. Mestier, C. Baraduc, B. Dieny, Journal of Physics D: Applied Physics, IOP, 2010, 43(21), pp. 215001.)

Self-heating is expected to become even more of a problem as both read/write speed and pattern density increase. On the one hand, self-heating can help reduce the switching current but on the other hand it can also reduce the device thermal stability and even the device reliability. Another challenge for STT-MRAM is the switching disturbance caused by stray magnetic fields from neighboring devices. These and other problems, such as undesirable stresses, related to STT-MRAM operation have been considered in the prior art, for example, in all of the following:

U.S. Patent: 20150091109 (Allinger et al.)
U.S. Pat. No. 9,024,399 (Guo)
U.S. Pat. No. 7,262,069 (Chung et al.)
U.S. Patent Application 2007/0058422 (Phillips et al.)
U.S. Pat. No. 8,194,436 (Fukami et al.)
U.S. Pat. No. 9,081,669 (Tadepalli et al.)
U.S. Pat. No. 8,125,057 (Bonin et al.)
U.S. Pat. No. 7,829,980 (Molla et al.)
U.S. Patent Application 2006/0273418 (Chung et al.)

It would indeed be desirable to effectively address the problems of self-heating, thermal stability, stresses and switching disturbances. If these problems can be addressed in a combined and efficient manner, it would be even more advantageous. Although the prior arts indicated above have discussed these problems, they have not addressed them in as comprehensive, effective and efficient a manner as in this disclosure.

SUMMARY

A first object of the present disclosure is to provide a method of protecting STT-MRAM devices from adverse thermal effects such as those resulting from self-heating induced by read/write operations.

A second object of the present disclosure is to provide a method to protect STT-MRAM devices from adverse switching effects due to the magnetic fields of neighboring devices.

A third object of the present disclosure is to provide a mechanism for reduction of stress within certain areas of the STT-MRAM device that is a result of the adverse thermal effects.

A fourth object of this disclosure is to use the same heat sink design to serve as a stress buffer for an MTJ device.

A fifth object of the present disclosure is to provide such a method that is able to simultaneously produce all of the above objects.

These objects will be achieved through the design and fabrication of a heat sink structure for STT-MRAM devices that will improve STT-MRAM device thermal stability. This heat sink structure will simultaneously serve as a magnetic shield and stress buffer for magnetic devices. An internal study has shown that top lead stress can affect DR/R and Hc. FIG. 1 shows these results. We are therefore provided with empirical evidence that the same heat sink design can also serve as a stress buffer for an MTJ device, where the stress includes intrinsic film tensile and compressive stresses plus the stress induced by differential expansion/contraction between the BIT line and the overall stack.

The present disclosure provides a design for a heat sink structure and its method of fabrication for an MTJ device, such as an MTJ device that can be integrated into a STT-MRAM device, so that the heat generated during the read/write cycle of such an MTJ device can be dissipated away much more quickly than occurs in an MTJ device that is fabricated using current methods. As a result, the MTJ device so designed and fabricated has its read/write reliability improved.

BRIEF DESCRIPTION OF THE DRAWINGS

FIG. 2 is a table (Table 1) listing the layer names and their functions corresponding to the "old" MTJ fabrication scheme illustrated in FIG. 4a-4e and currently in use.

FIG. 3 is a table (Table 2) listing the process flow steps corresponding to the fabrication scheme illustrated in FIG. 4a-4e.

FIG. 4a-4e is a schematic illustration showing the present magnetic tunneling junction (MTJ) structure and the fabrication process utilized to fabricate it.

FIG. 5 is a table (Table 3) listing the layer names and their functions corresponding to the presently disclosed fabrication scheme illustrated in FIG. 7 a-7f.

FIG. 6 is a table (Table 4) listing the process flow steps corresponding to the presently disclosed fabrication scheme illustrated in FIG. 7a-7f.

FIG. 8a-8d are a set of schematic illustrations showing an alternative magnetic tunneling junction (MTJ) structure providing equivalent properties to that shown in FIG. 7a-7f and the fabrication process utilized to fabricate it.

DETAILED DESCRIPTION

Figure 1A:
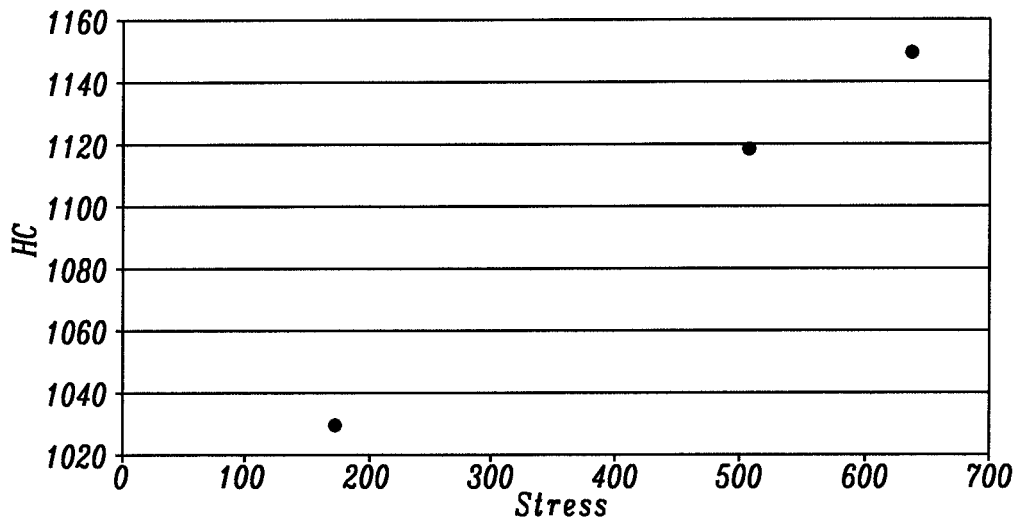
FIGS. 1a-1b display data that indicate how top lead stress can affect both DR/R and Hc.
Figure 1B:
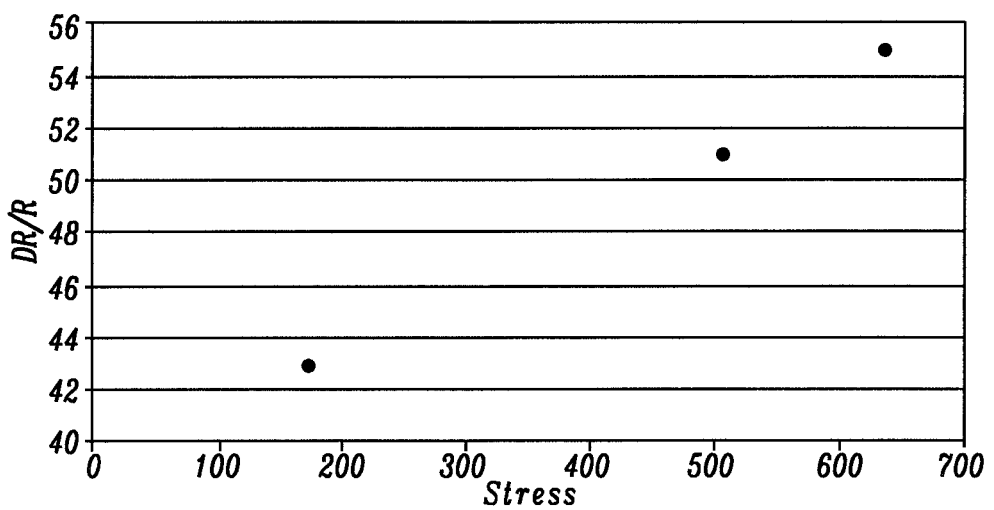

FIG. 2 illustrates a current integration scheme (i.e., prior art) used to fabricate an MTJ junction for an integrated MTJ device comprising a multiplicity of individually formed and encapsulated junctions. Such devices can be used to form STT-MRAM logic devices. The layer names and general process integration steps are listed in Table 1 (FIG. 2) and Table 2 (FIG. 3) respectively. In the current method, the first step is to deposit the basic unpatterned MTJ film stack and the etch-stop hard masks deposition within them that are used to pattern the stack into a multiplicity of smaller stacks so they can be integrated into a larger device.

Referring to the table shown in FIG. 2 and the corresponding schematic illustration of FIG. 4a, we see that the film stack deposition is a series of 5 layers, 14-10, where 10 is a pin layer, 11 is a barrier layer, 12 is a free layer, 13 is a first hard mask layer, such as Ta, TiN or other conductive material and 14 is a second hard mask layer such as the non-conductive material SiON, or the conductive material TiN. Layers 13 and 14 can be deposited using the same tool that deposits 10-12, or it can be deposited using a different tool. Note that the stack is assumed to be formed on an appropriate substrate such as a conducting bottom electrode (BE) so that when all the processing steps are completed the fabricated device can be easily integrated into desired circuitry.

According to the process steps listed in the table of FIG. 3 and the corresponding illustration in FIG. 4b, step 2 is the deposition of a photo-resist pattern layer, 15, on layer 14. Step 3 is to etch the MTJ deposition, leading to the two separate stacks shown in FIG. 4c. Note, in this description and those to follow we show an initial MTJ stack patterned into two separate stacks. For clarity, the two stacks are shown as isolated, it is assumed, of course, that they are resting on some substrate, but the substrate is not shown in the figure. The example of two stacks is arbitrary and chosen for simplicity and any number of stacks can be processed using these methods.

Step 4 is the deposition of an encapsulation layer (16 in FIG. 4d) which is a layer of dielectric material such as SiN, SiO2, Al2O3, MgO, or the like, deposited to a thickness of between approximately 20-200 A to protect the patterned MTJ stacks. The encapsulation layer also covers the substrate on which the stacks rest and which is not shown in FIG. 7c. This encapsulation layer, 16, can be deposited in-situ in the same tool that is used to etch the MTJ device or it can be deposited using a separate tool. This encapsulation layer is normally a dielectric material such as SiN, SiO2, Al2O3, MgO, or the like. This encapsulation layer can also be deposited initially as a metal layer and then be oxidized into a dielectric layer. The functionality of this encapsulation layer is not only to insulate the MTJ device from shorting, but also to preserve the magnetic properties and thermal stability of each MTJ device. Therefore, the selection of materials for this layer cannot be some random choice among dielectric materials.

Referring finally to FIG. 4e, there is shown step 5, which is to fabricate the connection of a BIT line, shown as 18, to the MTJ device. This is normally done by first depositing a space-filling interlayer dielectric film (ILD), shown as 17, and then doing chemical mechanical polishing (CMP) to planarize and open the MTJ device. Finally the BIT line 18 is formed to connect to the MTJ. Note that the CMP process removes the upper surface of the encapsulation layer 16 as well as second hard mask, 14, which opens the device to enable an electrical contact between the metal BIT line and first hard mask, 13. Note that the BIT line is normally formed by a dual Cu-damascene process that is well known in the art and will not be described herein.

The encapsulation layer, 16, normally has very low thermal conductivity. The interlayer dielectric material 17 also has very low thermal conductivity. The candidates for layer 17 are often SiN and SiO2. Due to the low thermal conductivities of the encapsulation layer and the ILD layer, the majority of the heat generated during read/write processes of the completed devices can only be dissipated by passing through the interface between MTJ and BIT line, 130, or the interface between the MTJ and BE (bottom electrode), 140. As the MTJ size decreases, the interface area between MTJ and BIT line and between the MTJ and BE also decreases. As a result, these interfaces become less efficient in dissipating heat, which can become an even worse problem as the read/write speed increases.

Figure 7A:
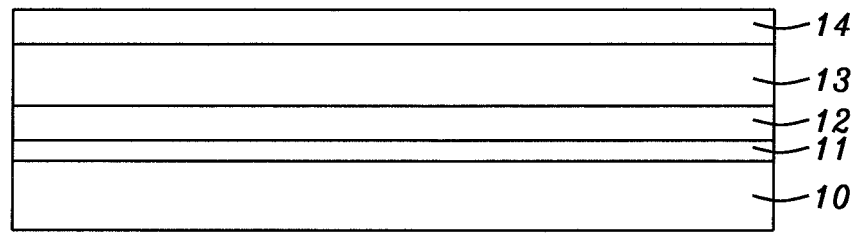
FIG. 7a-7f is a set of schematic illustrations showing the presently disclosed magnetic tunneling junction structure and the fabrication process utilized to fabricate it.
Figure 7B:
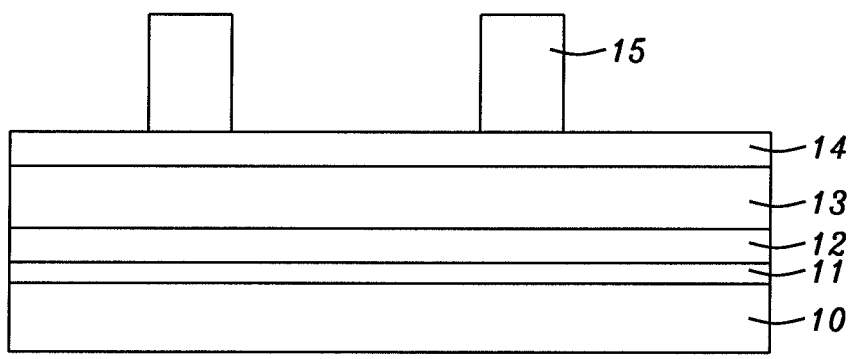
Figure 7C:
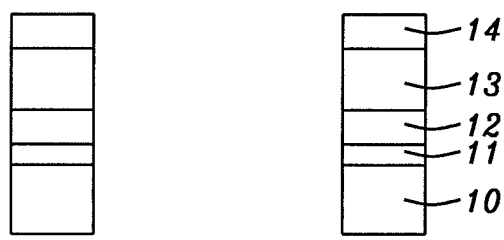
Figure 7D:
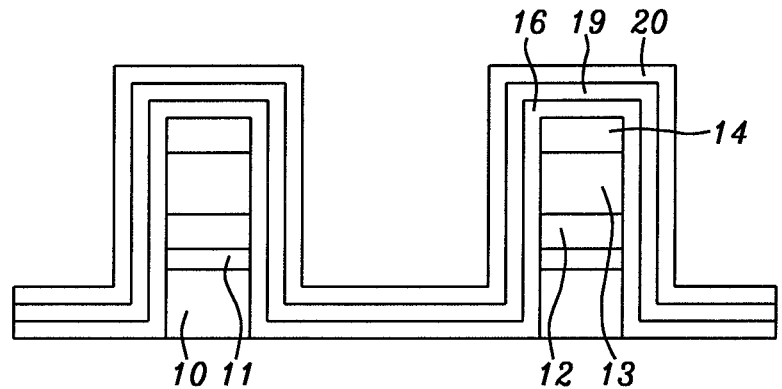
Figure 7E:
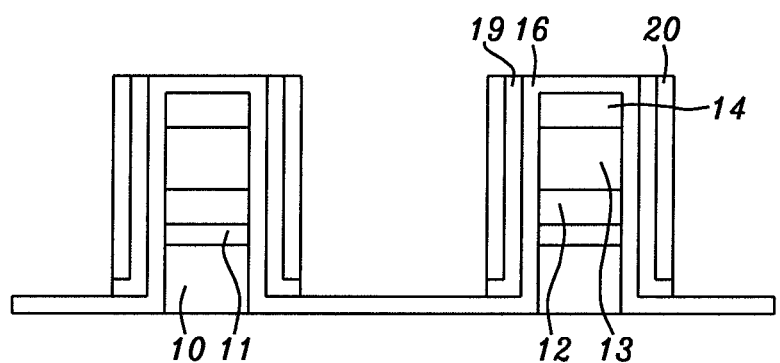
Figure 7F:
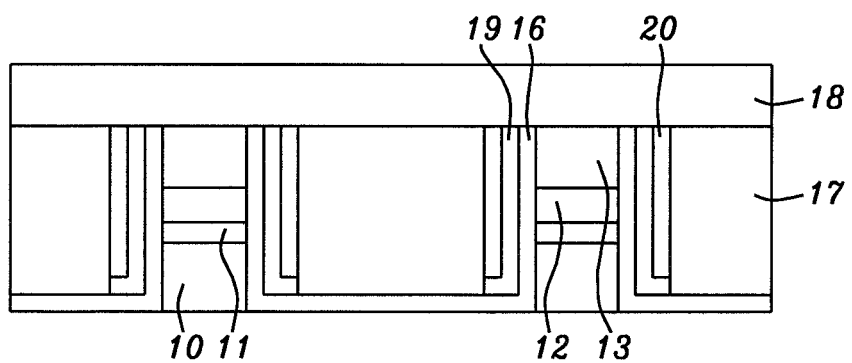

FIG. 7a-7f illustrate the new integration scheme for fabricating a MTJ device that will meet the objects described herein. The table in FIG. 5 and the table in FIG. 6 list the layer descriptions and process steps respectively for ease of discussion. The key differences between the currently used (prior art) method just described and illustrated in FIG. 4a-4e and the new method about to be described, are step 4 and step 5 of Table 4, and their corresponding illustrations in FIG. 7d-7e. In Step 4 shown in FIG. 7d, instead of depositing the single layer of encapsulation dielectric, 16, as in FIG. 4d of the prior art method, two additional encapsulation layers, 19 and 20 are added to augment layer 16, which is still deposited to a thickness between approximately 20-200 A. The second encapsulation layer (19 in FIG. 7d) is typically a layer of metallic material (electrically conductive or non-conductive and possibly magnetic) with high thermal conductivity, deposited to a thickness of between approximately 20-100 A, which will act as a heat sink layer. The third encapsulation layer, 20 in FIG. 7d, is a hard mask layer formed of $SiO_2$ or SiN to a thickness of between approximately 50-300 A which is to be used for patterning layer 19. The process for patterning layer 19 (Step 5 shown in FIG. 7e) is normally done by a commonly used self-alignment spacer etching method using layer 20 as a hard mask to align the etch, which is guided so that it stops at layer 16 and leaves pieces of layers 20 and 19 along the sidewalls. Note that the etch is a RIE etch of good selectivity between layers 19/20 and layer 16. An alternative etch scheme that uses different gasses can be used after the etch of layer 20, in which case layers 20 and 16 can be formed of the same dielectric materials. After the etch, layer 19 will be isolated from the MTJ etch device. Each individual layer 19, when patterned, will act like a small "bell jar" to surround each MTJ device. Layer 19 will subsequently act as a heat sink layer. After layer 19 layer is patterned in step 5 (FIG. 7e), an ILD layer 17 will be deposited (step 6 of FIG. 70 and followed with a CMP process to open both the heat sink layer, 19, and the MTJ device 13 at the same time. After that, a similar process like step 5 in FIG. 4e (prior art method) will be used to fabricate a BIT line (18 of FIG. 70 to electrically connect to the MTJ and layer 19. Note that the etch process has removed layers 19 and 20 from all but the sides of the two patterned MTJ stacks, while the CMP process removes the tops of layer 16 and all of layer 14 so the BIT line connection can be made.

When magnetic permeable material (such as NiFe, etc.) is used for layer 19, this layer can then be used as magnetic shield to absorb the stray magnetic flux from adjacent devices and protect the MTJ device. Depending on the magnetic material selection (it should have good thermal conductivity), this structure can serve both as a heat sink and as a magnetic shield. At the same time, the surrounding stress on the MTJ device can be modulated by inserting a layer 19 that is formed of materials of different elastic constants.

Referring next to schematic FIG. 8a-8d, there is illustrated and described (using the steps in the table of FIG. 6) an alternative design (second embodiment) of a heat sink and magnetically shielded MTJ device that also meets the described objects set forth above.

FIG. 8a-8d schematically illustrates this second embodiment of the method which begins where step 3, shown in FIG. 7c, ends. We assume that steps 1, 2 and 3 of this second embodiment are identical to those three steps previously illustrated in FIG. 7a-7c and described in table of FIG. 6. FIG. 8a now immediately follows the structure shown in FIG. 7c and shows an encapsulation process that replaces that in FIG. 7d and which was described as step 4 in the table of FIG. 6. In FIG. 8a of this alternate embodiment, the patterned MTJ stack of FIG. 7c has already been encapsulated by layer 16, which is now followed by successive encapsulations of three additional layers, 19, 19a and 20. Layer 19 is the heat sink layer and layer 19a is the magnetic shield. These are now two different layers (19 and 19a) which are both formed to thickness between 20-100 A, whereas previously a single layer could serve as both the heat sink and magnetic shield layer if it was both magnetic and heat conducting. The deposition sequence order between 19 and 19a can be changed. But in whichever order they are deposited, these two layers are now patterned separately by first patterning layer 19 using a self-aligned etch process, then depositing layer 19a and etching it away using another photo-etch process.

FIG. 8d shows an alternative approach to replace FIG. 8c. The difference here is that the magnetic shield layer is patterned in separate step that removes encapsulation layer 19 so that magnetic shield layer 19a now remains exposed on top of the MTJ stack where it can contact the BIT line 18.

As is finally understood by a person skilled in the art, the detailed description given above is illustrative of the present disclosure rather than limiting of the present disclosure. Revisions and modifications may be made to methods, materials, structures and dimensions employed in forming and providing a thermally and magnetically shielded MTJ device, while still forming and providing such a structure in accord with the spirit and scope of the present invention as defined by the appended claims.

What is claimed is:

1. A method of forming a magnetic thin film device, comprising:
   providing a thin film deposition;
   patterning said thin film deposition to produce a multiplicity of separate stacks;
   depositing a first encapsulation layer conformally over all exposed top and side surfaces of said stacks, said encapsulation layer being an oxidation prevention layer;
   forming a second encapsulation layer conformally over said first encapsulation layer, said second encapsulation layer being a heat sink layer, wherein said heat sink layer is chosen to have a coefficient of thermal expansion that provides stress relief during device operation;
   forming a third encapsulation layer conformally over said second encapsulation layer, said third encapsulation layer being a hard mask layer for patterning said heat sink layer;
   removing an upper portion of said heat sink layer by using said hard mask layer to create a self-aligned etch process, said etch process leaving remaining side portions of said heat sink layer to surround said first encapsulation layer that still conformally covers said stacks
   filling all spaces within said patterned deposition using an interlayer dielectric; and
   creating a planar top surface of said encapsulated deposition by a CMP process that removes portions of said encapsulated patterned deposition including upper portions of said first encapsulation layer and said heat sink layer and exposing an electrically conducting portion of said deposition to which an electrical connection can be made; then
   forming a conducting BIT line over said planarized surface to electrically contact said exposed upper portions of all said depositions, wherein said first encapsulation layer extends continuously from one stack to another stack after the forming of the conducting BIT line.

2. The method of claim 1 wherein said thin film deposition is an MTJ stack.

3. The method of claim 2 wherein said MTJ stack is patterned to form at least two separate stacks of identical dimension.

4. The method of claim 3 wherein said patterned MTJ stack comprises a lamination of horizontal, planar layers, said layers including, from the bottom up, a pinned layer, a tunnel barrier layer, a free layer, a first hard mask layer and a second hard mask layer.

5. The method of claim 1 wherein said first encapsulation layer is a layer of SiN, $SiO_2$, AlO, AN or MgO formed to a thickness between approximately 20-200 A.

6. The method of claim 1 wherein said heat sink layer is a material chosen from the following group of materials having high thermal conductivity, Ti, TiN, Cu, Ta, TaN, W, Al and AN formed to a thickness between approximately 20-100 A.

7. The method of claim 1 wherein said interlayer dielectric fill material is $SiO_2$ or SiN.

8. The method of claim 1 wherein said third encapsulation layer that serves as a hard mask layer is a layer of $SiO_2$ or SiN formed to a thickness between approximately 50-300 A.

9. The method of claim 1 wherein said heat sink layer is a material having magnetic permeability chosen from NiFe or CoFe whereby it serves as a magnetic shield as well as a heat sink.

10. The method of claim 1, wherein the heat sink layer disposed along a side surface of one of the stacks has an L-shaped cross-sectional profile after the forming of the conducting BIT line.

11. The method of claim 1, wherein the first encapsulation layer, the heat sink layer and the hard mask layer all physically contact the interlayer dielectric after the forming of the conducting BIT line.

12. A method comprising:
   patterning a film layer to form a film stack, the film stack having opposing side surfaces and a top surface extending between the opposing side surfaces;
   forming a first encapsulation layer directly on the opposing side surfaces and the top surface of the film stack;
   forming a heat sink layer over the first encapsulation layer;
   forming a second encapsulation layer over the heat sink layer;
   removing a portion of the second encapsulation layer and a portion of the heat sink layer disposed over top surface of the film stack to expose a portion of the first encapsulation layer that is disposed directly on the top surface of the film stack;
   removing the portion of the first encapsulation layer to expose the top surface of the film stack;

after the removing of the portion of the first encapsulation layer to expose the top surface of the film stack, forming an interlayer dielectric layer on remaining portions of the first encapsulation layer, the heat sink layer and the second encapsulating layer; and forming a conductive line on the exposed top surface of the film stack, wherein the remaining portions of the first encapsulation layer, the heat sink layer and the second encapsulation layer all physically contact the interlayer dielectric layer after the forming of the conductive line.

13. The method of claim 12, wherein the film stack is an MTJ stack.

14. The method of claim 13, wherein the MTJ stack comprises a lamination of horizontal, planar layers, said layers including, from the bottom up, a pinned layer, a tunnel barrier layer, a free layer, a first hard mask layer and a second hard mask layer.

15. The method of claim 14, wherein the first hard mask layer includes a conductive material and the second hard mask layer includes a non-conductive material.

16. The method of claim 12, wherein the heat sink layer includes a material having magnetic permeability such that the heat sink layer also serves as a magnetic shield.

17. The method of claim 16, wherein the material is selected from the group consisting of NiFe and CoFe.

18. The method of claim 12, wherein the first encapsulation layer is formed of a first material selected from the group consisting of SiN, $SiO_2$, $Al_2O_3$, and MgO, and
wherein the second encapsulation layer is formed of a second material selected from the group consisting of $SiO_2$ and SiN.

19. The method of claim 12, wherein the film stack includes a plurality of film stacks, and
wherein the remaining portion of the first encapsulation layer extends continuously from one film stack to another film stack after the forming of the conductive line.

20. A method of forming a magnetic thin film device, comprising:
providing a thin film deposition;
patterning said thin film deposition to produce a multiplicity of separate stacks;
depositing a first encapsulation layer conformally over all exposed top and side surfaces of said stacks, said encapsulation layer being an oxidation prevention layer;
forming a second encapsulation layer conformally over said first encapsulation layer, said second encapsulation layer being a heat sink layer, wherein said heat sink layer is chosen to have a coefficient of thermal expansion that provides stress relief during device operation;
forming a third encapsulation layer conformally over said second encapsulation layer, said third encapsulation layer being a hard mask layer for patterning said heat sink layer;
removing an upper portion of said heat sink layer by using said hard mask layer to create a self-aligned etch process, said etch process leaving remaining side portions of said heat sink layer to surround said first encapsulation layer that still conformally covers said stacks filling all spaces within said patterned deposition using an interlayer dielectric; and
creating a planar top surface of said encapsulated deposition by a CMP process that removes portions of said encapsulated patterned deposition including upper portions of said first encapsulation layer and said heat sink layer and exposing an electrically conducting portion of said deposition to which an electrical connection can be made; then
forming a conducting BIT line over said planarized surface to electrically contact said exposed upper portions of all said depositions, wherein the first encapsulation layer, the heat sink layer and the hard mask layer all physically contact the interlayer dielectric after the forming of the conducting BIT line.

* * * * *